United States Patent [19]

Oates

[11] Patent Number: 4,852,059

[45] Date of Patent: Jul. 25, 1989

[54] CONTENT ADDRESSABLE MEMORY

[75] Inventor: Martin Oates, North Brickhill, England

[73] Assignee: Texas Instruments Incorporated, Dallas, Tex.

[21] Appl. No.: 142,758

[22] Filed: Jan. 11, 1988

[51] Int. Cl.$^4$ ............................................. G11C 15/00
[52] U.S. Cl. ...................................... 365/49; 364/200; 364/900
[58] Field of Search ................... 365/49; 364/200, 900

[56] References Cited

U.S. PATENT DOCUMENTS 3,733,589  5/1973  Thompson ........................... 365/49
3,742,460  6/1973  Englund ............................. 365/49

Primary Examiner—Terrell W. Fears
Attorney, Agent, or Firm—Michael E. Melton; Leo N. Heiting; Melvin Sharp

[57] ABSTRACT

A content addressable memory consists of a plurality of memory units each of which may be an integrated circuit. Each unit receives an input group of digits forming all or part of an input key code, and compares it simultaneously with a plurality of equally sized groups of digits stored in the memory of the unit. The memory of a unit has 32K bytes of storage elements functionally arranged in 512 rows and column. The 64 bytes forming a row are each compared with an input group of 8 binary digits. A status bit is produced for each of the 64 bytes of a row and indicates whether or not the input group matches the particular byte. The match need not be perfect and certain digits may be masked so that comparison of them does not detract from the match assessment. The status bits are combined logically to produce higher and higher order status bits selectively indicating the presence of a match in larger and larger groups of storage elements up to the entire memory of the unit. The single highest level status bit from each unit is combined logically with similar bits from other units to produce even higher order status bits. The status bits are stored so that the addresses of groups matching the input group can be discovered from them. For an input key code having several input groups of digits, the input groups are applied sequentially to the units. The units also produce a "just one" output when only a single match to an input group is found. The "just one" outputs are combined logically to produce a hierarchy of "just one" outputs similar to that of the status bits. For a multi-input group key code, the "just one" output can be used to terminate the search before all input groups have been searched for.

15 Claims, 6 Drawing Sheets

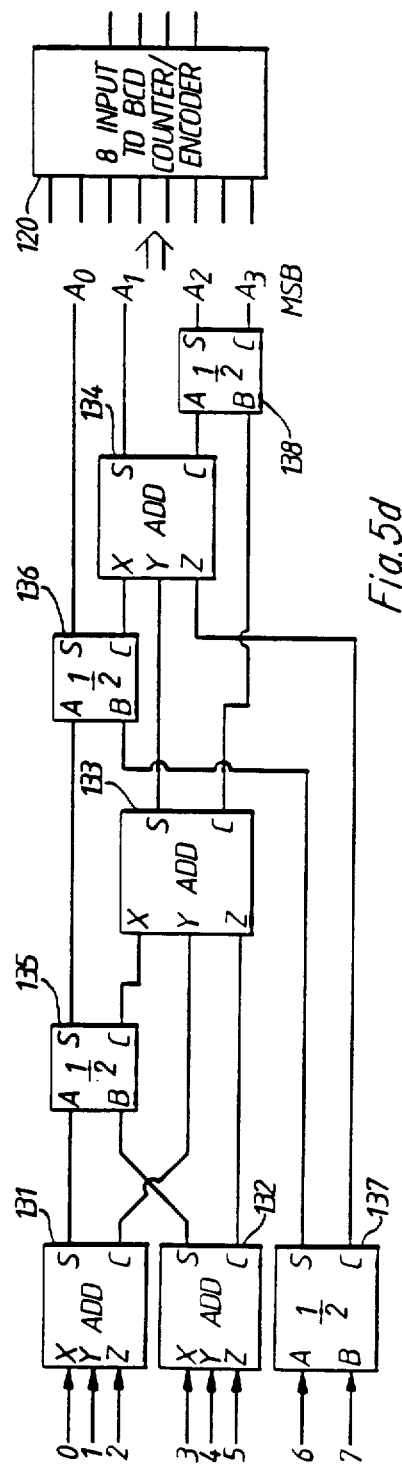
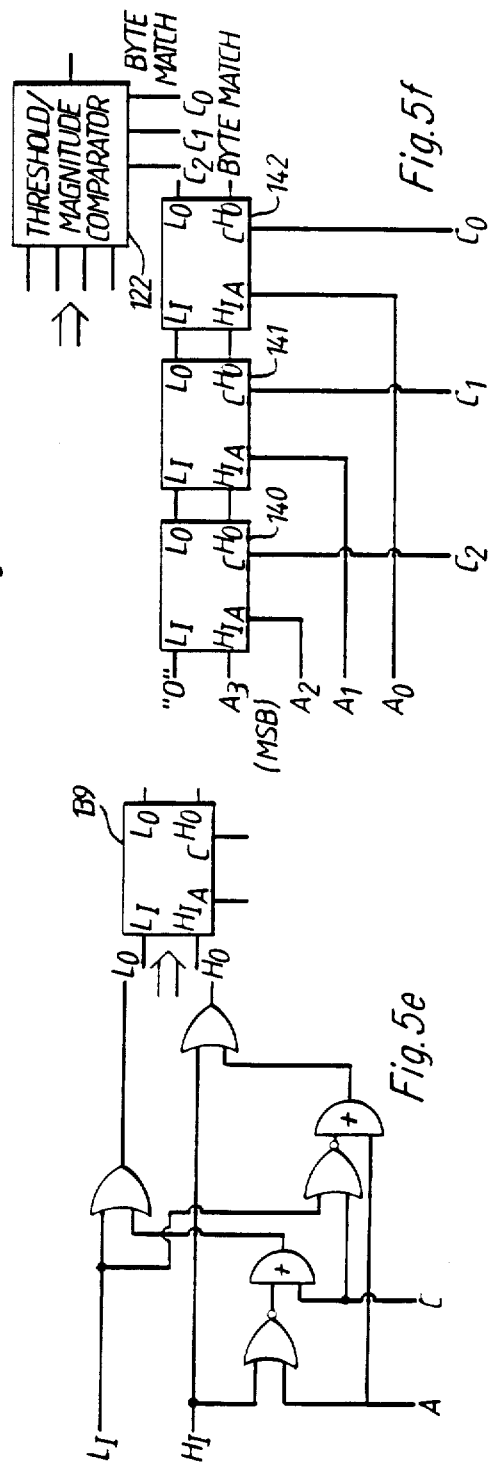
Fig.5d
Fig.5e
Fig.5f

CONTENT ADDRESSABLE MEMORY

This invention relates to a content addressable memory or associative memory.

In a digital computer the storage of data is usually provided by means including a random access memory in which a particular item of data is accessed by its location in the memory. For some applications, however, it is more convenient and usually leads to faster processing to access stored data by reference to a part of the data itself instead of to its location. For example, if the stored data were a telephone directory, then to ascertain the telephone number of Mr. J. Smith it would be relatively straightforward to find the number if the names were stored in alphabetical order. However, if only the telephone number were known and the data were stored with the names of the subscribers in alphabetical order it would be necessary to search through the directory until a matching number was found. A content addressable memory is designed to perform the latter operation quickly and efficiently. The actual location of the data in the memory is of no significance except to the computer, which has the advantage that additions can be made to the stored data wherever there is room for it. Such memories also have applications in so-called artificial intelligence and by virtue of the nature of the operations required content addressable memories of large capacity are needed. A large content addressable memory is expensive because it needs to be specially constructed with many digit channels in parallel in the interests of a high speed of operation. Whilst a large conventional random access memory could be operated as a content addressable memory by reading the contents of the addresses sequentially and comparing the outputs with the input data until a match were found, this would be impractically slow for any serious application.

It is an object of the present invention to provide an improved form of construction of a content addressable memory which could enable such a memory to be produced more economically.

According to one aspect of the present invention there is provided a content addressable memory having a plurality of substantially identical content addressable memory units, the units storing data and producing and storing status digits indicating the occurrence of matches to an input key code wherever they occur amongst the data stored therein, means for applying to all of the units substantially simultaneously an input key code to be matched, and gating and storing means responsive to the status digit outputs from the memory units to produce and store higher level status digits and a highest level single status digit indicating the presence or absence of a match to the input key code in the entire memory, the status digits and their storage being such that the location in the memory of all matches to an input key code can be derived from them.

The content addressable memory units may be constructed as integrated circuits so that a memory would be made from an appropriate plurality of integrated circuits with input means for the input key code and gating means and storage means for producing and storing the higher level status digits.

According to a second aspect of the present invention there is provided a content addressable memory including a plurality of substantially identical memory units each having input means for an input group of digits to be matched by the data stored in the particular unit and producing a status digit output indicating whether or not a match for the input group has been found, means for applying a key code including at least one input group to the input means of each unit, logical combining means responsive to the status digit output of each unit to produce a single status digit indicating whether or not the input key code is matched by the data stored anywhere in the memory, and storage means for the logically combined status digit outputs, each memory unit including a plurality of storage elements accessible in blocks, each block including the same number of elements in a plurality of equal groups, addressing means for selecting a block of elements and reading therefrom the data stored in it, comparator means having a plurality of data bit comparators respectively corresponding to the storage elements in a block, the comparators being in groups each of the same number as the digits in the input group, each comparator having first and second inputs and producing a data bit match indication as to whether or not the data bits applied to the two inputs are the same, the first inputs being connected to receive signals from the selected block of elements and the second inputs of each group of comparators being connected to receive from the input means the input group of digits, assessment means responsive to the match indications from the comparators group by group to produce a first level status output for each group indicating whether or not the input group matches the data from the storage elements of the corresponding group of the selected block, logic means for combining the status outputs to produce one or more higher levels of status output, finally producing the status digit output, and storage means for storing the status outputs of all levels produced in the unit whereby the stored status outputs enable the address in the memory of any matches to the input key code to be derived.

The assessment means may include inputs for mask data indicating which, if any, outputs of a group can be ignored in the matching of the input group to the stored data, and arrangements of logic gates responsive to the mask data and the match indications and from which the base level status outputs are derived. One possible use for the mask is to eliminate from the matching operations that bit of ASCII character codes which indicates whether it is an upper case or a lower case character. The matching of the input group to the stored data need not require the matching of all digits in the groups, whether or not mask data is involved in the matching, and assessment means may include a means for producing the base level status output in each group in response to the data bit match indications from the comparator taking into consideration an input to the memory unit indicating the number of digit matches in a group required for the group of stored data to be considered to match the input group.

The input key code may include more than one input group and the memory may include means for applying the input groups in sequence to all of the units, the resulting stored status outputs being combined to provide an indication of the presence or absence of a match to the entire input key code in the memory.

A memory according to the invention may also include means for counting the number of matches found to part or all of an input key code and for producing a particular output when only one match has been found after a search of any part or all of the entire memory. When the particular output is produced for matches to part only of an input key code the address of the match found may be determined from the outputs and the continuation of the search for the remaining part of the input key code may be inhibited.

The invention has the advantage that the memory can be made of any size by using as many memory units as necessary with simple gates combining the status outputs, so that a computer connected to the memory can locate any matching group and read out other data stored adjacent thereto. A memory unit may be made in the form of a single integrated circuit, and the storage elements may be either static or dynamic random access memory elements.

In a memory unit at least part of the storage means for storing the status outputs of all levels produced in the unit may be of the same type as the storage elements used to store data and may be accessed at least partially by the addressing means for the storage elements so that they can also be used for storing data when not required to store status digits.

A group may conveniently consist of 8 binary digits, termed a byte, and a block may comprise $2^n$ such bytes. A typical block may include 64 bytes or 512 bits and in the example to be described a memory unit stores 32K bits having 512 rows and columns.

According to further aspect of the present invention there is provided a content addressable memory in which an input key code consisting of a plurality of digits is compared with the contents of the memory and an output is produced indicating the presence in the memory of matches to the input key code, wherein the memory includes means for producing an indication when only one match to the input key code is found in the whole of or in a predetermined part of the memory.

The memory may be arranged so that the input key code is applied to it as successive groups of digits with indications produced of matches found to as much of the input key code as had been entered at the time, and the means for producing an indication when only one match is found, used to terminate the application of further groups of digits of the input key code once only a single match has been found in all of or in a predetermined part of the memory.

Indications of the finding of at least one match and the finding of only one match from several memory unit may be continued by a logical hierarchy to produce such indications for the combination of memory units.

In order that the invention may be fully understood and readily carried into effect an example of it will now be described with reference to the accompanying drawings, of which:

Figure 3:
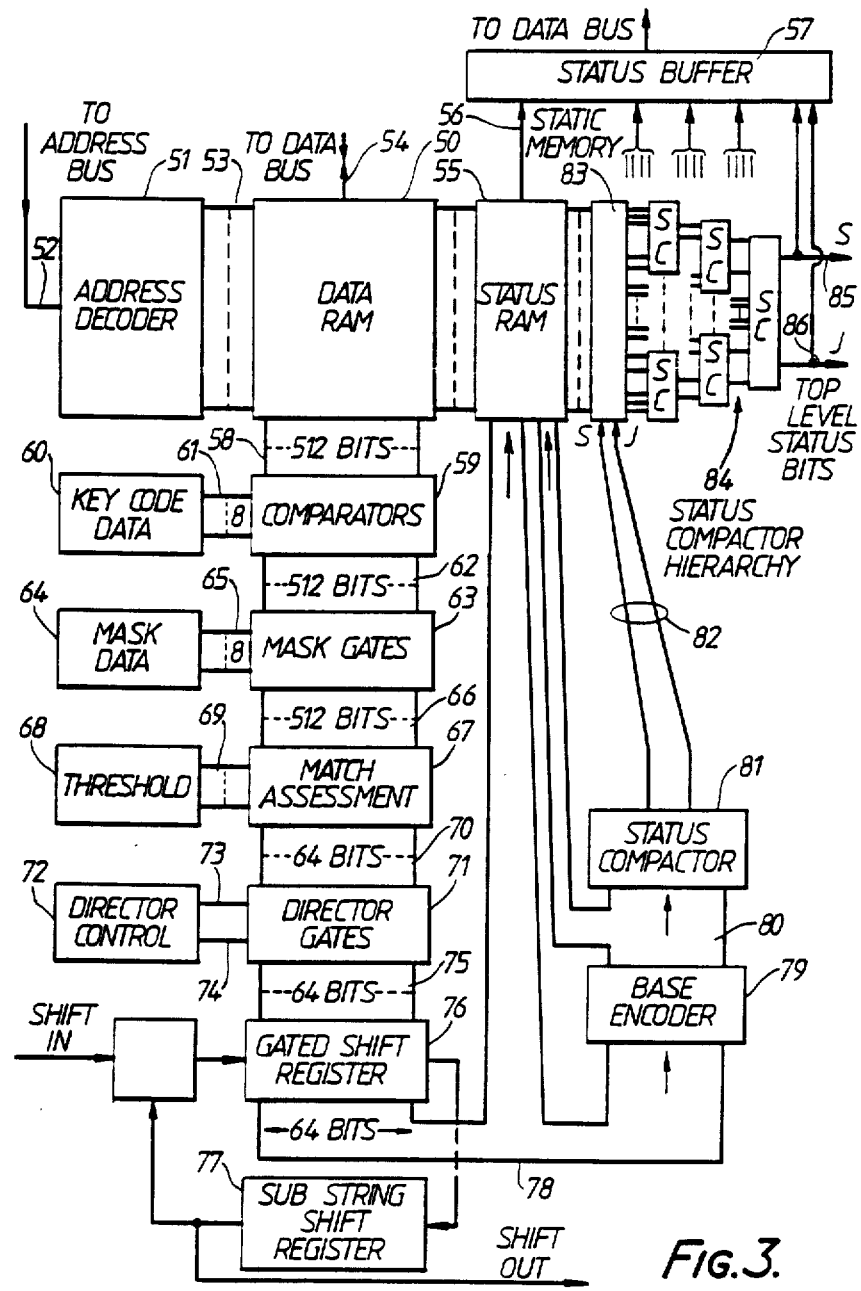
FIG. 3 is a block diagram of a memory unit of the memory shown in FIG. 2.
Figure 4A:
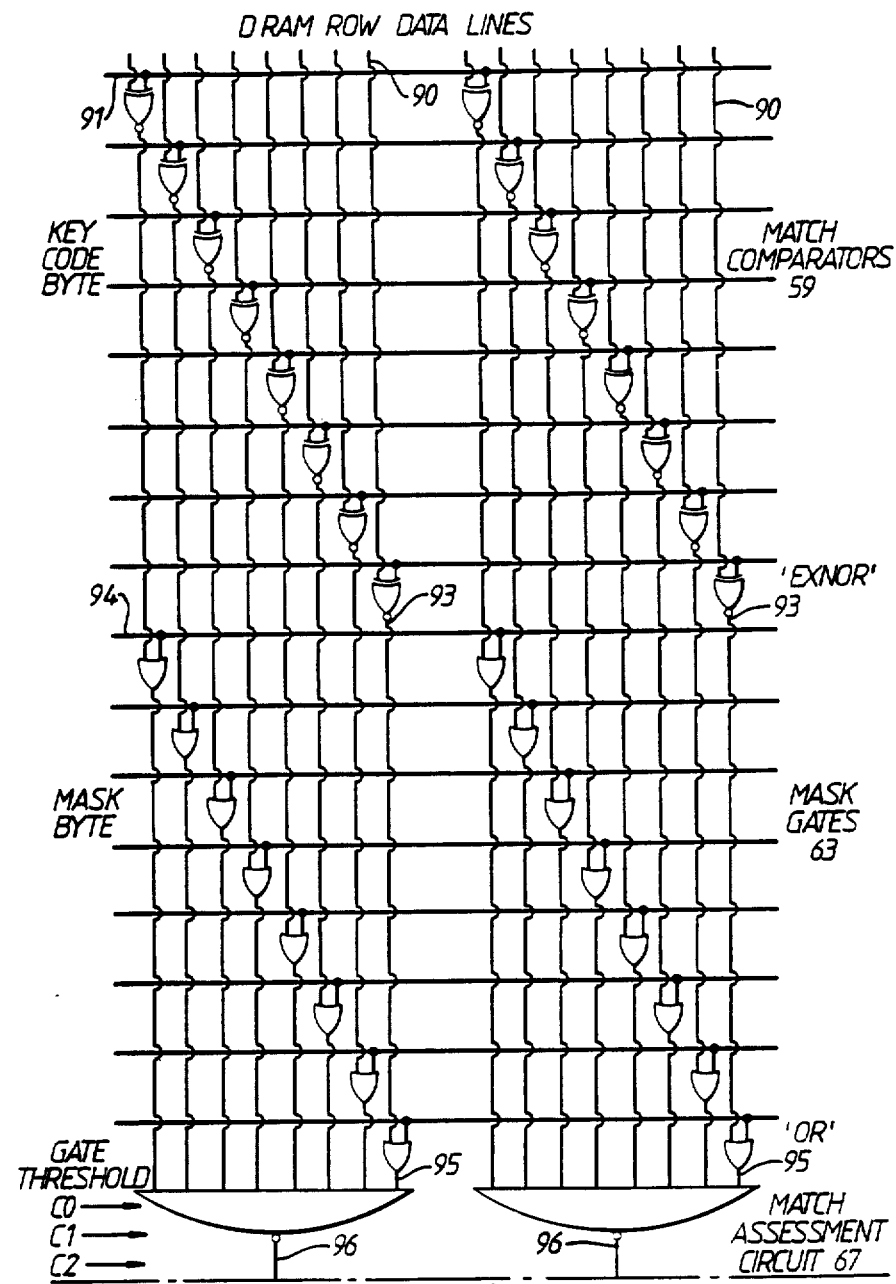
Figure 4B:
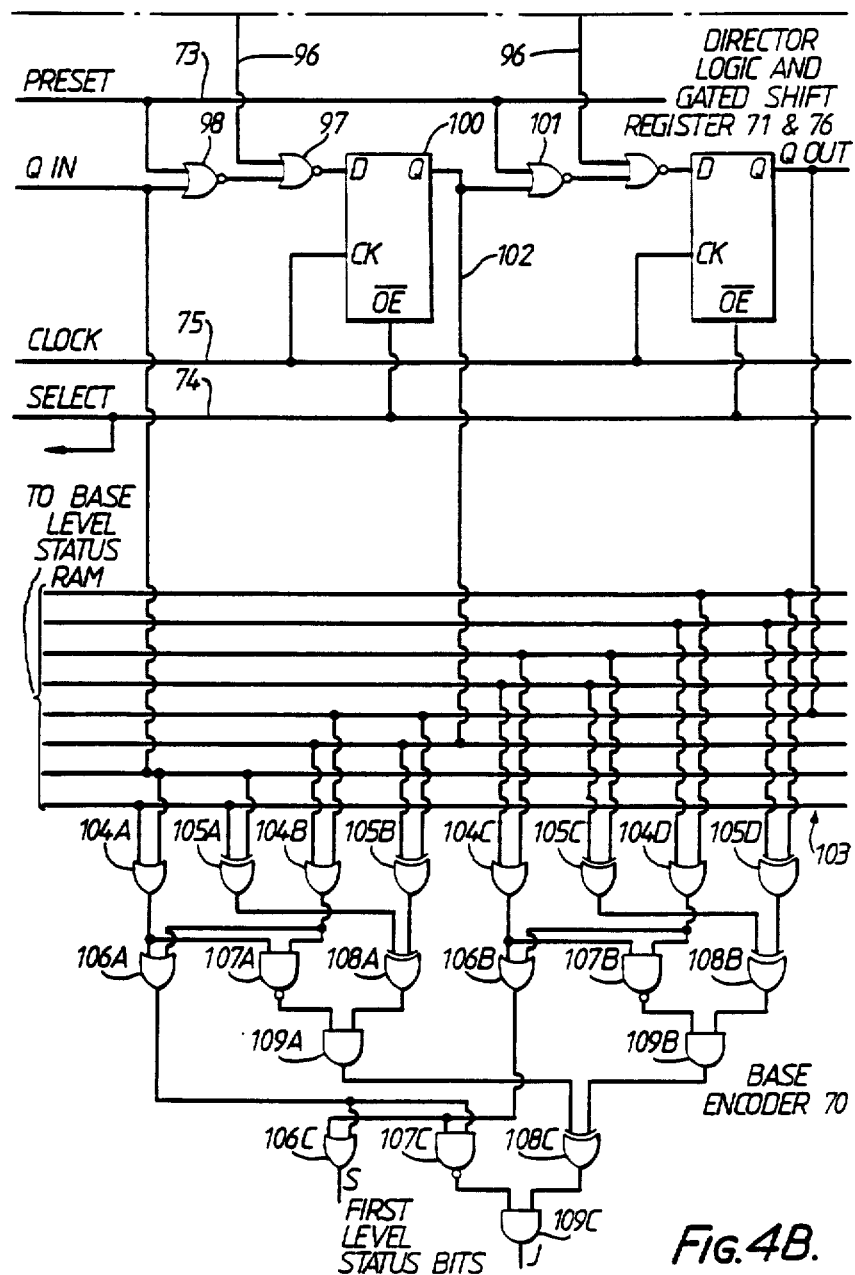

FIG. 4 composed of FIG. 4A and 4B shows in more detail part of the unit shown in FIG. 3; and FIGS. 5(a) to 5(f) show the construction of one example of an adjustable threshold match assessment block which could be used in the unit shown in FIG. 3.

Figure 1:
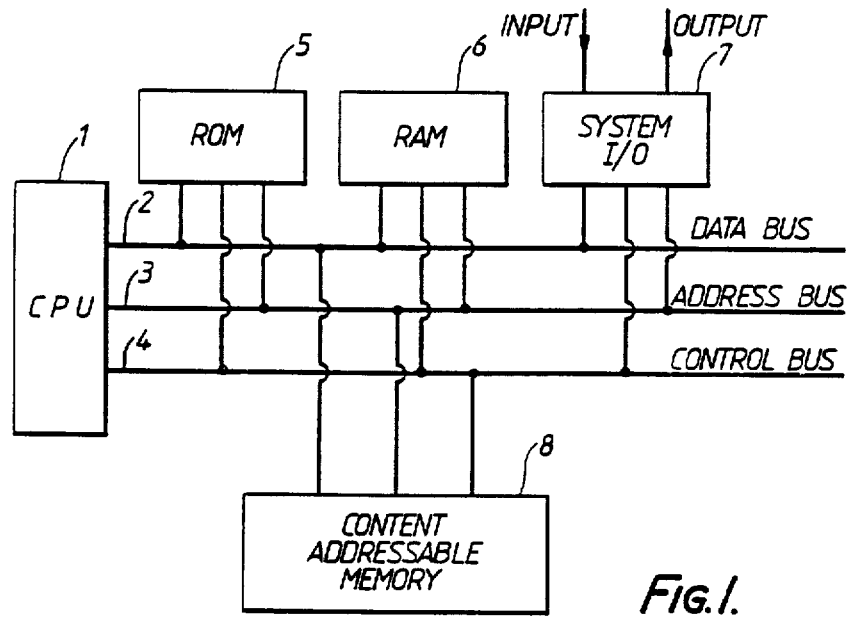
FIG. 1 is a block diagram of a digital computer incorporating a content addressable memory.

The computer shown in FIG. 1 has a central processing unit 1 connected to multibit parallel data, address and control buses 2, 3 and 4. To these buses are connected a read-only memory 5, random access memory 6, system input/output units 7 and a content addressable memory 8. The control bus 4 may be combined with the address bus 3 so that all of the peripherals of the computer are memory mapped. However, for the purpose of this specification the control bus is considered to be separate from the address bus and is connected to the content addressable memory 8 for the purpose of instructing that memory to record data applied to it, to seek for data matching an input group or to enable data to be read from a particular address of the memory in the same way as in a random access memory.

When use is to be made of the content addressable memory 8 after data has been recorded in it, an input group of digits, termed a key code, is applied to the memory which independently of the operation of the CPU 1 compares the key code with every group of digits recorded in the memory and produces status information indicating whether or not a match has been found. On the basis of this status information the CPU calculates the address in the memory 8 of each matching group and accesses these addresses to read therefrom the data associated with the input group. The information read from memory 8 is then available for use by the computer in any manner required. Since information can be written into and read from the memory 8 by reference to the addresses, this memory can also be used as an extension to the RAM 6 and the memory 8 may also be arranged to release for the storage of the data the registers of the memory which would be used for storage of the status information when it is operated as a content addressable memory. As will be evident from the following description additional memory capacity equal to about one-sixth of the addressable space of the memory will be required for recording the status information and a feature of an example of the present invention is that only one command register need be retained exclusively for status-related information if the additional memory is also used as random access memory.

Figure 2:
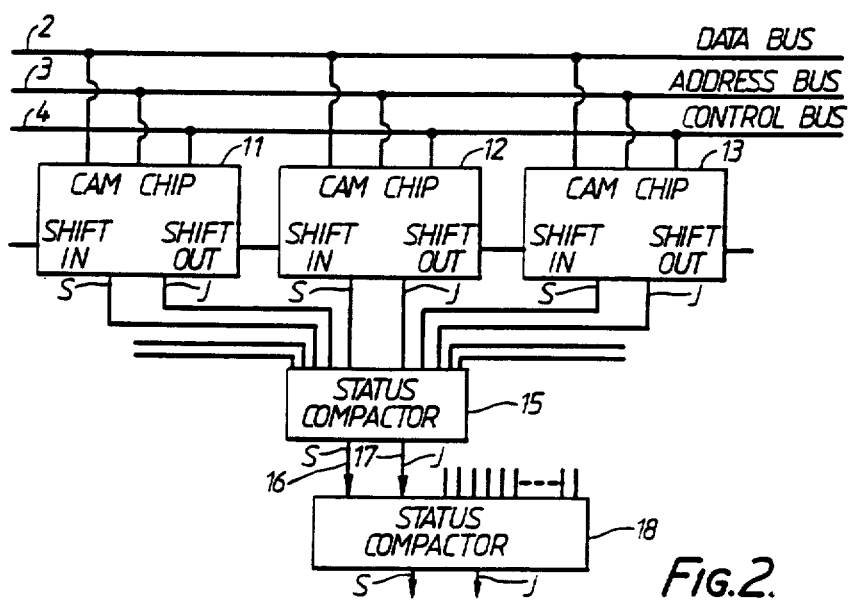
FIG. 2 is a block diagram of a part of a content addressable memory according to one example of the invention.

FIG. 2 shows in block diagrammatic form part of the components making up the memory 8 and its connections to the buses 2, 3 and 4. The memory shown in FIG. 2 contains a plurality of content addressable memory unit integrated circuits (CAM chips) of which three only are shown carrying the references 11, 12 and 13. Each of these circuits includes its own status information store and has a first output connection S for a single status digit indicating whether or not a match has been found to an input key code among the data stored in the particular unit and a second output connection J (for another signal) indicating whether or not only one such match has been found. The conductors S and J are connected in groups of eight to status comparators of which one only is shown having the reference 15. The output of the comparator 15 appears on the conductors 16 and 17 and are applied to the inputs of a further comparator 18 along with the outputs from 7 other comparators similar to the compactor 15. conductor 20. The hierarchy of compactors continues to as many levels as are required to accommodate the number of CAM chips.

The signals on the S and J conductors from the CAM chips and from the status compactors are made available to the CPU via the data bus 2, the connections to the data bus not being shown but including tri-state buffers. It is not necessary for the status compactors to include any means for storing the status data provided that the status stores in the CAM chips and the type of logical elements used in the status compactors are such that the higher level status data signals can be generated when required.

The circuits 11, 12 and 13 are also provided with "shift in" and "shift out" connections, which enable a key code stored partly in one circuit and partly in the next to be located.

In operation, an input key code for which a match is sought is applied to all of the memory units, each of which is arranged to compare the input key code with the data recorded in it and produces on the output conductor S a "1" if a match has been found and a "0" if no match has been found and similarly a "1" on the output conductor "J" if only one match is found and a "0" otherwise. The units also record within their own status stores the status information resulting from each comparison of the input key code with their corresponding group in the unit in such a way that the status information can be read from the status store by the CPU 1 and used to enable it to calculate the address in the particular unit of each match to the input group found. Assuming that the status output appearing on the conductors S and J from the compactor 18 is the highest level output produced by the memory, then it could include up to 64 memory units connected in groups of 8 to compactors like the compactor 15 which are connected in turn to the single higher level compactor 18. If it is required to construct a memory of greater capacity then one or more further levels of compactor could be added, each extra level permitting the capacity of the memory to be increased by a factor of 8. Of course, it is not necessary to restrict the compactors to having 8 pairs of inputs and gates having a different number of inputs could be used instead.

In a particular example of the memory unit to be described, it contains 512 rows of dynamic RAM storage elements, with each row containing 512 elements. This means that the memory just described consisting of 64 chips would have a maximum capacity of 16 megabits.

The memory unit shown in FIG. 3 is of a practical size for use in the memory shown in FIG. 2 and provides for the storage of data a dynamic RAM 50 of 512 rows each of 512 elements. The address decoder 51 receives address information from the address bus via a channel 52. The decoder 51 has 512 outputs 53 used to address the rows of the RAM 50. The data is entered into and read from the RAM 50 via a channel 54 connected to the data bus. In practice, the data bus may have 8 conductors and the communication between the data bus and the RAM may be in 8 bit groups in parallel, the address decoder 5, being arranged to control the communication with the data bus in this way. The address conductors 53 are also connected to a status RAM 55 having an output channel 56 via a status buffer 57 to the data bus. A static memory 83 containing two memory elements for each row of the RAM 50 is also connected to the row address conductors 53. The construction of the status RAM 55 and the static memory S3 is such that the status bits derived as a result of the comparison of an input key code with the data stored in the RAM 50 can be read from them by the address decoder 51 and the output supplied to the data bus in such a way that the CPU can calculate the location in the RAM 50 of the matching groups stored in it. Other outputs from the decoder 51 cause the selection of either the data RAM 50, the status RAM 55 or the static memory 83.

The RAM 50 has 512 column conductors to which corresponding elements of each row are connected so that when a row of elements is addressed by the decoder 51 the corresponding binary data appears on the column conductors. These conductors, indicated by the reference 58, are connected to 512 data bit comparators 59 which are connected to receive an 8-bit group of bits from the key code (a key code byte) to be matched from a key code data store 60 via an 8-bit channel 61. The key code data store 60 can record a multibyte key code and is arranged to apply the bytes in turn through the channel 61 to the comparators 59. The comparators 59 are divided into groups of eight and the key code byte fed via the channel 61 is applied to each group of comparators 59 at the same time. The comparators 59 therefore compare the key code byte with the 64 bytes received in parallel from the RAM 50 via the column conductors 58 and produce output bits indicating whether or not the two inputs to the comparators are the same or different. The comparators themselves, which may be constructed as exclusive NOR-gates, have their output bits conveyed by 512 conductors 62 to 512 mask gates 63 which are connected in groups of eight to receive 8-bit mask data from a mask data store 64 via an 8-bit channel 65. The mask gates 63 operate to transmit the bits received from the comparators 59, unless a bit of the mask data is a "1" indicating that the particular bit of the 8-bit group is of no significance in the matching, when the corresponding mask gates produce a "1" output bits of the mask gates 63 are applied via 512 bit conductors 66 to match assessment circuits 67 which, in a simple case, may be 8 input NAND-gates.

In the embodiment shown, however, the circuits 67 have an adjustable threshold responsive to threshold data stored in a threshold store 68 and applied to the circuits 67 via a channel 69. The match assessment circuits 67 are 64 in number and each receives eight inputs from the mask gates 63. The circuits 67 receive from the threshold store 68 a binary code indicating the number of bits within a group of eight which need to be 1's for a match to the input group by the corresponding data group to be recorded. For an exact match the threshold store 68 would provide a binary 111 output indicating to the match assessment circuits that for a match to be recorded eight 1's must be applied to each of them. If a less accurate match is all that is required, for example only 5 bits are needed to be 1's for a match to be recorded, the threshold store 68 would provide a binary 100 output to the circuits 67 (the actual threshold being one plus the number from the threshold 68).

The outputs of the match assessment circuits 67 consist of 64 match bits corresponding respectively to the 64 8-bit groups read from the RAM 50. These 64 match bits are conveyed by 64-bit conductors 70 to director gates 71 controlled by signals from a director control unit 72 applied via conductors 73 and 74. The outputs of the director gates are connected through a channel 75 to a gated shift register 76 whose output is connected to its input through a substring shift register 77. "Shift in" and "shift out" connections are also provided to enable the contents of the shift register relating to the last row of one chip to be transferred to the shift register of the next chip for concatenation with its contents. This facility has the advantage that the RAMs of several chips can effectively be joined in series. In the example to be described in detail with reference to FIG. 4, the director gates are incorporated in the shift register. The 64 stages of the shift register 76 are connected to the status RAM 55 by means of a 64-way conductor 78 which also supplies the 64 match bits to a base encoder 79. The base encoder 79 serves to produce from each of the eight 8-bit groups in the 64 match bits two output bits, one's indicating that there is at least one "1" in the particular 8-bit group and the other, J, indicating that there is only one "1" in the 8-bit group. The sixteen output bits from the base encoder 79 are applied via conductors 80 to the status RAM 55 where there are stored in a location corresponding to the row of the RAM 50 from which they were derived, and to the inputs of a status compactor 81. The status compactor 81 produces two output bits only for each row of the RAM 50 and these bits appear on conductors 82, one bit indicating that there is at least one "1" in the 64 match bits applied to the base encoder 79 and the other indicating that there is only one "1" in those 64 match bits. The two output bits are supplied to a static memory 83, which also has storage locations for each row of the RAM 50.

In the example being described the RAM 50 has 512 rows, so that the static memory 83 has 512 pairs of memory elements. It is to be noted that the RAM 50 and the status RAM 55 are constructed of dynamic memory elements whereas the static memory 83 has static memory elements. The memory 83 produces continuous outputs representing the stored bits which are applied to a status compactor hierarchy 84 for compacting the 512 pairs of bits from the memory 83 in three stages down to one pair of bits which appear on output conductors 85 and 86 respectively. The compactors of the hierarchy 84 are individually of the same construction as the compactor 81 which will be described with reference to FIG. 4, and are arranged in three groups corresponding respectively to the stages of the hierarchy. The first group has 64 compactors for compacting the 512 pairs of bits from the memory 83 down to 64 pairs of bits. The second group of 8 compactors compacts the 64 pairs of bits down to 8 pairs. The third group contains one compactor which produces one pair of bits from the 8 pairs. The outputs of the groups of compactors in the hierarchy 84 are produced continuously in response to the continuous outputs from the memory 83 and are also applied to the status buffer 57, together with signals from the status RAM 55. The data fed to the data bus by the status buffer 57 enable the CPU to identify the locations of matches to the key code in the RAM 50.

In an alternative construction to that shown in FIG. 3 the static memory 83, the compactor hierarchy 84 and the part of the status buffer 57 to which they are connected could be contained in a separate chip from the remainder of the memory unit. Such a separate chip should also include address decoding circuitry to keep down the number of connections to be made to the chip.

In the operation of the unit shown in FIG. 3, the address decoder 51 is caused to read the rows of storage elements in the RAM 50 in turn and to produce the corresponding 512 bits for application to the comparators 59. The comparators 59 compare each group of 8-bits from the RAM 50 with the 8-bit group from the key code data store 60 and produce corresponding comparison bits. These comparison bits are modified by the addition of the 1's required by the mask data and the 8-bit groups are assessed by the gates 67 which produce indications (match bits) as to whether or not the particular group of 8-bits read from the RAM 50 matches, within the terms set by the mask data and the threshold the 8-bit group received from the key code data store 60. These 64 match bits from the gate 67 are stored in the stages of the shift register 76 and if the key code is only a single byte long the director gate 71 and shift register 76 take no further part in the operation of the unit. The match bits stored in the shift register 76 are transferred to the status RAM 55 where they are in an address corresponding to that of the row of the RAM 50 from the data in which they were derived. The base level status bits derived from the base encoder 79 are also stored by the RAM 55.

The base level status bits from the base encoder 79 consist of pairs of bits, an S bit indicating the presence of at least one match and a J bit indicating the presence of only one match. These are compacted down to a single pair of bits for each row of the RAM 50, which are stored in the static memory 83. The compactor hierarchy 84 compacts these further to a pair of bits only indicating respectively the presence of at least one match in the contents of the RAM 50 and the presence of only one match in the contents of the RAM 50.

If, however, the key code consists of more than one byte, the key code bytes are applied in turn to the comparators 59 and the corresponding match bits from the gates 67 are combined with the match bits already stored in the shift register 76 so that a "1" for a match is only stored if the preceding byte of match data also recorded a match. As will be described later with reference to FIG. 4, the director gates operate in conjunction with shift register 76 to combine logically the match bits resulting from the match assessment of all of the bytes of the key code data to record 1's in only those stages of register 76 where the matching data is to be found in the selected row of the RAM 50. The substring shift register 77 is required to provide the necessary additional storage where a match may possibly extend from the end of one row to the beginning of the next. The "shift in" and "shift out" connections provide for serial continuation to the rows of the RAMs of adjacent chips.

If each row of the RAM 50 were to include more than 512 storage elements and/or the base encoder and/or the status compactor were to handle lower numbers of inputs, further levels of status compactor could be added to the unit.

FIG. 4 shows in more detail the comparators 59, the mask gates 63, the match assessment gates 67, the director gates 71 and the gated shift register 76 of the memory unit shown in FIG. 3. For reasons of clarity, only 16 data-bit conductors from the RAM 50 are shown and only 2 match bit conductors 96. The components shown in FIG. 4 would be repeated a further 31 times to provide all the components indicated in the corresponding part of FIG. 3. Two sets of 8 data lines 90 are shown in FIG. 4 and would be connected to the column conductors of the data RAM 50 (FIG. 3). The 8 bits of the key code byte from the key code data store 60 are applied in parallel via conductors 91. The comparators themselves are exclusive NOR-gates and produce corresponding comparison bits on conductors 93. The mask gates 6 which are OR-gates receive as one input the comparison bits on conductors 93 and as the second input a mask byte via 8 parallel conductors 94. The outputs of the gates 63 appear on conductors 95 and are applied to 8 input NAND-gates 67 used for match assessment. The gates 67 could be simply of threshold 8 or may be circuits having adjustable threshold to provide for imperfect matches, in which case, the thresholds of the circuits 67 would be controlled by the threshold information from the store 68 which is represented by the three bits C0,C1,C2. An actual construction of the gates 67 having adjustable threshold will be discussed later with reference to FIG. 5. The outputs from the circuits 67 on conductors 96 are applied through respective sets of director logic 71 to the stages of the gated shift register 76. In the embodiment being described the director logic is incorporated into the gated shift register. A "preset" signal is applied via a conductor 73 and a "select signal" is applied via a conductor 74. Clock signals for the shifting register are applied via a conductor 75.

One conductor 96 is connected to an input of a NOR-gate 97 which receives its second input from the output of another NOR-gate 98. One input of the gate 98 is connected to the "preset" conductor 73 and the other input to the Q output of a not-shown preceding stage of the shifting register. The output of the NOR-gate 97 is applied to the digit input of an edge-triggered D-type flip-flop 100 acting as a stage of the gated shift register and the Q output of which provides the nth match bit output to the status RAM on a conductor 102. The clock signals on the conductor 75 are applied to the clock input of the flip-flop 100. The flip-flop 100 is also provided with an OE input controlled by the "select" signal on conductor 74. The Q output on conductor 102 also is applied to a NOR-gate 101 forming part of the next stage of the shift register.

The "preset" and "select" signals are produced by the director control unit 72 (FIG. 3) at the required times as described below. Both the stages of the shift register and the base level status RAM have "output enable" (OE) control inputs which are connected to the conductor 74, so that when the "select" signal is "1" the outputs of the base level status RAM are applied to the NOR-gates 98, 101, etc., and when the "select" signal is a "0" the output of shifting register flip-flop 100 etc. are connected to the NOR-gate 98, 101, etc. The base level status RAM is not shown in FIG. 4, but the storage elements of it have their inputs and outputs connected to a tri-state status bus 103 of which eight lines are shown, but which has 64 lines in all.

The operation of a single stage of the director logic 71 and the gated shift register 76 will now be described, these two parts of the memory operating together. The match bits appear in inverted form at the outputs of the match assessment NAND gates 67, the single bit output from each gate indicating whether or not a match is found to the particular byte of the key code data. Simultaneously with the match bit output relating to the first (or only, if the key code data consists of a single byte) byte of the key code data a "preset" signal on conductor 73 forces the output of NOR-gate 98 to be low so that the NOR-gate 97 serves to reinvert the status bit which is stored in upright form in the flip-flop 100 in response to a clock pulse on the conductor 75. The stored match bit then appears as the Q output of the flip-flop 100 which is conveyed by the conductor 102 to the corresponding element of the base level status RAM, and also to an input of the NOR-gate 101 of the next shifting register stage.

Typically, the input key code consists of 4 bytes which are applied in succession to the match comparators 59 so that for each byte a match bit appears in inverted form at the output of each NAND-gate 96. The match bits for the first byte become stored in the flip-flops 100 etc. of the gated shifting register 76 as described above and these stored bits control the transfer of the match bits for the second byte into the register 76. The "select" signal on the conductor 74 is "0" at this time permitting the flip-flops to produce outputs and blocking any outputs from the status RAM. Only if a match to the first byte was found in the immediately preceding byte of the memory can a match bit representing a match to the second byte be registered. For the stage including the flip-flop 100 the match bit for the first byte appears on conductor labelled Q IN and is directed by the gate 98 to the gate 97. If that match bit is a "1" then the output of the gate 98 is low permitting the match bit output from the NAND-gate on conductor 96 to pass through the gate 97 and be registered in upright form in the flip-flop 100.

The direct connection of the "Q" output of the preceding stage in this way permits the control to be fast enough for the 4 bytes of the key code to be applied in succession to the comparators 59 and for the direct logic to operate within the duration of a single access to the row of the data RAM 50. The period of time needed to read a row of the RAM 50 (FIG. 3) is about four times the period of time needed by the gates forming the comparators, mask gates, match assessment gates and director gates to pass signals applied to them and therefore it is possible to carry out the tests to determine the matching of a four byte key code from the match data store 60 as each row of the RAM 50 is read.

Should the key code consist of more than four bytes, then it is divided into 4-byte blocks and after the matching tests for a first 4-byte block have been completed, the corresponding match bits are transferred from the stages of the shift register 76 to the status RAM 55. This process is carried out for the whole of the RAM 50 and then repeated for the second 4-byte block of the key code. When the first byte of the second 4-byte block is applied the "select" signal on the conductor 74 is a "1", thus inhibiting the flip-flops 100 etc. from producing outputs and enabling the status RAM to produce outputs. The "preset" signal on the conductor 73 is a "0" at this time (it is a "1" for the first byte only of a key code). The match bits stored in the status RAM therefore control the entry of the output of the NAND gates 67 into the flip-flops 100 etc. by means of the gates 97, 98, etc.

In order to allow for the matching string of data to be stored from the end of one row of the RAM 50 to the start of the next row the match bits from the last stages of the shift register 76 are propagated into the sub-string shift register 77 and from there back to the start of the shift register 76. The match bits in the sub-string shift register 77 can then be used to adjust the status bits produced at the start of the next row of the RAM 50. The "shift in" and "shift out" connections enable the detection of a matching string extending between the RAMs of different chips.

From the match bits stored in the stages of the shifting register 76 and appearing on the conductors of the status bus 103 two status bits are generated for each row of the RAM 50 processed. The first status bit is referred to as S and is a "1" if at least one of the match bits is a "1". The second status bit is referred to as J (for just one) and is a "1" if one and only one of the match bits is a "1". These status bits are produced from the group of eight match bits shown in FIG. 4 by the logic gates occupying the lower part of the figure. The logic gates shown form one eighth part of the base encoder 79, and would be repeated a further seven times for the remainder of the 64 conductors of the status bus 103.

As shown in FIG. 4, each pair of conductors of the bus 103 is connected to the inputs of an OR-gate 104A, 104B, 104C or 104D and an exclusive OR (XOR) gate 105A, 105B, 105C or 105D. The outputs of OR-gates 104A and 104B are applied to OR-gate 106A and NAND-gate 107A. The outputs of OR-gates 104C and 104D are applied to OR-gate 106B and NAND-gate 107B. The outputs of XOR-gates 105A and 105B are applied to XOR-gate 108A. The outputs of XOR-gates 105C and 105D are applied to XOR-gate 108B. The outputs of NAND-gate 107A and XOR-gate 108A are applied to AND-gate 109A. The outputs of NAND-gate 107B and XOR-gate 108B are applied to AND-gate 109B.

The outputs of OR-gates 106A and 106B are applied to OR-gate 106C and to NAND-gate 107C. The outputs of AND-gates 109A and 109B are applied to XOR-gate 108C. The outputs of NAND-gate 107C and XOR-gate 108C are applied to AND-gate 109C.

The output of the OR-gate 106C is the first level status bit S, and the output of the AND-gate 109C is the first level status bit J. These status bits relate to only the eight match bits on the eight conductors shown of the status bus 103, and there would be seven other pairs of status bits relating to the remaining conductors of the status bus 103.

In order to derive a single pair of status bits from the eight pairs produced by the base encoder 79, the outputs of the base encoder are applied to the status compactor 81; they are also fed to the status RAM 55 as shown in FIG. 3.

The status compactor 81 is similar in construction to the base encoder 79 in that it uses repetitions of the logic circuit formed by an OR-gate 106, a NAND-gate 107 and XOR-gate 108 and an AND-gate 109 as shown in FIG. 4. In the status compactor this logic circuit appears seven times, with four circuits feeding two circuits feeding one circuit, connected in the manner shown in the base encoder 79. The status compactor 81 does not include OR-gates 104 or XOR gates 105 used in the base encoder, but has the inputs of the gates 106, 107 and 108 of a circuit connected directly to the output of gates 106 and 109 of the two circuits preceding it in the tree.

Such a status compactor produces a compaction of the status bits of eight to one, but it could clearly be constructed to produce a compaction by any desired factor, odd or even using the appropriate configuration of the logic circuits described. The base encoder could be similarly modified.

The operation of a logic circuit formed by an OR-gate 106, a NAND-gate 107, an XOR-gate 108 and an AND-gate 109 will be apparent from a consideration of the function of the circuit to combine two pairs of status bits into one pair of status bits. The OR-gate 106 combines the S bits. The XOR-gate 108 combines the J bits, but its output needs to be corrected to allow for the fact that a preceding circuit will produce a J bit of "0" when it receives two J bits of "1". The NAND-gate 107 achieves this by blocking the AND-gate 109 when both preceding circuits produce an S bit of "1".

The match assessment gates 67 may be 8 input NAND circuits of adjustable threshold and whilst these could be realised by the use of digital to analogue converters followed by analogue threshold gates or by counters with the ability to be preset to the complement of the threshold, a purely digital circuit arrangement which avoids the possible inaccuracies of the analogue construction and the time delays of a counter is shown in FIGS. 5A to 5F. The circuit shown in FIG. 5A has an 8 input to binary coded decimal counter encoder 120 connected by four parallel conductors 121 to a threshold/magnitude comparator 122 to which the binary representation of the threshold C0,C1,C2 is also applied and which produces on output conductor 123 a "1" if the number of "1" inputs applied to the block 120 exceeds the threshold set by C0,C1,C2.

Figure 5A:
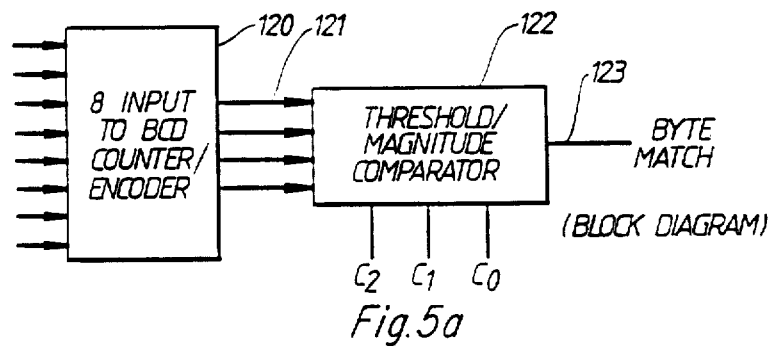
Figure 5B:
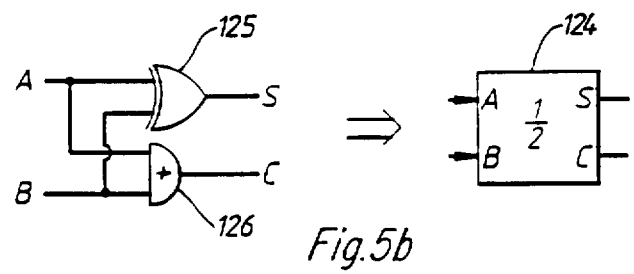

FIG. 5B shows a half adder 124 and its possible construction using an exclusive OR-gate 125 and an AND-gate 126.

Figure 5C:
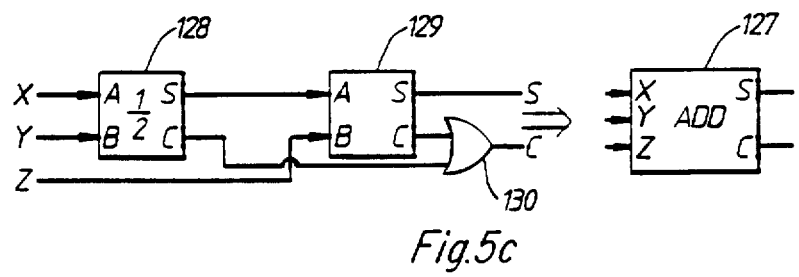

FIG. 5C shows a full adder 127 and its possible construction from two half adders 128 and 129 with an OR-gate 130.

FIG. 5D shows a form of construction of the 8-input to binary coded decimal counter encoder 120 using four full adders 131,132,133,134 and four half adders 135,136,137,138. Of the 8 input conductors, three are applied to the inputs of each of the full adders 131 and 132 and two are applied to the inputs of the half adder 135, the sum output of which is added to the sum output of the half adder 137 in the half adder 136, so that the sum output of the half adder 136 is the least significant bit of the BCD output. The carry outputs of the full adders 131 and 132 and the half adder 135 are added by the full adder 133, the sum output of which is added to the carry output of the half adders 136 and 137 in the full adder 134, the sum output of which forms the next bit of the BCD output. The third and fourth bits of the BCD output are produced respectively from the sum and carry outputs of the half adder 138 which receives the carry outputs of the full adders 133 and 134.

FIG. 5E shows the construction of one stage 139 of the threshold/magnitude comparator 122, and FIG. 5F shows the connection of three such stages 140,141,142 to form the threshold/magnitude comparator 122. The logic in the three stages 140,141,142 is arranged so that "1" applied to the "H" input of the stage 140 or generated in response to the BCD bits A and the threshold bits C by the logic is directed by the gates to produce a "1" output at the HO output of the stage 142 if the number of 1's received on the 8 input conductors exceeds the threshold. The logic is based on the fact that the larger of the two numbers, A3,A2,A1,A0 representing the BCD number, and C2,C1,C0 representing the threshold, will have a "1" where the other has a "0" in the most significant place where there is a difference between the two numbers.

Although it would be possible to construct each memory unit with separate data and status RAM's, if it were likely that the unit would simply be required to store data at some time, then it would be desirable to be able to make use of the status RAM for storing data. This could be done by combining the data and status RAM's in a single array of elements as a conventional read/write RAM and providing a control register for storing the address of the first or last register in the RAM which is used for the storage of status data when the unit is operating as content addressable memory, the usage of the various addresses being controlled by the CPU in response to a special program. Other registers could be used under program control for the key code data, the mask data and the threshold.

I claim:

1. A content addressable memory having a plurality of substantially identical content addressable memory units, the units in use storing data and producing and storing status digits indicating the occurrence of matches to an input key code wherever they occur amongst the data stored therein, means for applying to all of the units substantially simultaneously an input key code to be matched, and gating and storing means responsive to the status digit outputs from the memory units to produce and store higher level status digits and a highest level single status digit indicating the presence or absence of a match to the input key code in the entire memory, the status digits and their storage being such that the location in the memory of all matches to an input key code can be derived from them.

2. A memory according to claim 1 in which each memory unit is a single integrated circuit having input means for the input key code and means for producing the status digit output indicating whether or not matches to the input key code occur in the data stored in the particular memory unit.

3. A memory according to claim 1 in which the gating means includes a plurality of levels of OR-gates, the outputs of the gates of one level forming the inputs of the gates of the next higher level, and the outputs of the gates of the different levels also being applied to the storing means to record therein status digits corresponding to the different levels of gates.

4. A content addressable memory including a plurality of substantially identical memory units each having input means for an input group of digits to be matched by the data stored in the particular unit and producing a status digit output indicating whether or not a match for the input group has been found, means for applying a key code including at least one input group to the input means of each unit, logical combining means responsive to the status digit output of each unit to produce a single status indicating whether or not the input key code is matched by the data stored anywhere in the memory, and storage means for the logically combined status digit outputs, each memory unit including a plurality of storage elements accessible in blocks, each block including the same number of elements in a plurality of equal groups, addressing means for selecting a block of elements and reading therefrom the data stored in it, comparator means having a plurality of data bit comparators respectively corresponding to the storage elements in a block, the comparators being in groups each of the same number as the digits in the input group, each comparator having first and second inputs and producing a data bit match indication as to whether or not the data bits applied to the two inputs are the same, the first inputs being connected to receive signals from the selected block of elements and the second inputs of each group of comparators being connected to receive from the input means the input group of digits, assessment means responsive to the match indications from the comparators group by group to produce a first level status output for each group indicating whether or not the input group matches the data from the storage elements of the corresponding group of the selected block, logic means for combining the status outputs to produce one or more higher levels of status output, finally producing the status digit output, and storage means for storing the status outputs of all levels produced in the unit whereby the stored status outputs enable the address in the memory of any matches to the input key code to be derived.

5. A memory according to claim 4 wherein the assessment means includes inputs for mask data indicating which, if any, digits of a group can be ignored in the matching of the input group to the stored data, and arrangements of logic gates responsive to the mask data and the match indications from the comparators to produce the first level status outputs.

6. A memory according to claim 4 wherein the assessment means is responsive to a further input to the memory indicating the number of digit matches required in a group for a group of stored data to be a match to the input group so as to produce the first level status outputs in response to the bit match indications taking into consideration the required number of digit matches as indicated by the further input.

7. A memory according to claim 4 for an input key code including more than one input group including means for applying the input groups in sequence to all of the units and means for combining the resulting stored status outputs from all of the units to provide an indication of the presence or absence of a match to the entire input key code in the memory.

8. A memory according to any of claims 4 wherein each unit includes means for producing a further output when only one match is found to part or all of an input key code after a search of any part or all of the memory contained in the unit.

9. A memory according to claim 8 including means for logically combining the further outputs of the units to produce a single output from the memory indicating whether or not only one match has been found to part or all of an input key code.

10. A memory according to claim 9 for an input key code including more than one input group, the memory including means for terminating a search, before the entire input key code has been applied to the units, in response to the generation of the single output indicating that only one match has been found in the entire memory to the part of the input key code so far applied, the terminating means also enabling the output of the address of the only one match found.

11. A memory according to any of claims 4 including means for counting the number of matches found to part or all of an input and for producing a particular output when only one match has been found after a search of any part or all of the entire memory.

12. A memory according to any of claims 4 wherein each memory unit is made in the form of a single integrated circuit.

13. A memory according to any of claims 4 wherein in each memory unit at least part of the storage means for storing the status outputs of all levels produced in the unit are of the same type as the storage elements used to store data, and the addressing means for the storage elements can be used in accessing the storage means for storing the status outputs.

14. A memory according to any of claims 4 wherein an input group of digits consists of 8 binary digits.

15. A memory according to claim 14 wherein each memory unit includes 32K bytes of storage elements functionally arranged in 512 rows and columns, and a block of storage elements comprises a row of 512 elements.

* * * * *